United States Patent
Grecu et al.

(10) Patent No.: US 12,273,977 B2
(45) Date of Patent: Apr. 8, 2025

(54) HIGH CURRENT, LOW DROPOUT DRIVER CIRCUIT

(71) Applicant: Apple Inc., Cupertino, CA (US)

(72) Inventors: Cristian Grecu, Landshut (DE); Nicola Rasera, Munich (DE); Bogdan-Eugen Matei, Bavaria-Bayern (DE); Fabio Ongaro, Unterhaching (DE)

(73) Assignee: Apple Inc., Cupertino, CA (US)

( * ) Notice: Subject to any disclaimer, the term of this patent is extended or adjusted under 35 U.S.C. 154(b) by 17 days.

(21) Appl. No.: 18/338,916

(22) Filed: Jun. 21, 2023

(65) Prior Publication Data

US 2024/0431001 A1 Dec. 26, 2024

(51) Int. Cl.
*H05B 45/30* (2020.01)
*G05F 1/575* (2006.01)
*H03M 7/16* (2006.01)
*H05B 45/34* (2020.01)
*H05B 45/397* (2020.01)

(52) U.S. Cl.
CPC ........... *H05B 45/397* (2020.01); *G05F 1/575* (2013.01); *H03M 7/165* (2013.01); *H05B 45/34* (2020.01)

(58) Field of Classification Search
CPC ...... H05B 45/30; H05B 45/34; H05B 45/345; H05B 45/395; H05B 45/397; G05F 1/44; G05F 1/575; H03M 7/165
See application file for complete search history.

(56) References Cited

U.S. PATENT DOCUMENTS

| | | | |
|---|---|---|---|
| 10,349,478 B2 | 7/2019 | Morales et al. | |
| 10,439,421 B2 | 10/2019 | Jefremow et al. | |
| 11,847,982 B1* | 12/2023 | Yang | G09G 3/3406 |
| 2008/0315778 A1 | 12/2008 | Tatsukawa | |
| 2013/0057165 A1* | 3/2013 | Ide | G09G 3/3406 |
| | | | 315/186 |
| 2013/0214700 A1 | 8/2013 | Barnett | |
| 2021/0259073 A1 | 8/2021 | Hu et al. | |
| 2021/0378066 A1 | 12/2021 | Difazio et al. | |

FOREIGN PATENT DOCUMENTS

| | | |
|---|---|---|
| CN | 114842808 A | 8/2022 |
| EP | 3790360 A1 | 3/2021 |

OTHER PUBLICATIONS

International Search Report and Written Opinion in PCT Appl. No. PCT/US2024/032748 mailed Sep. 30, 2024, 9 pages.

* cited by examiner

*Primary Examiner* — Long Nguyen
(74) *Attorney, Agent, or Firm* — Kowert, Hood, Munyon, Rankin & Goetzel, P.C.; Dean M. Munyon

(57) ABSTRACT

A high current, low dropout driver circuit is disclosed. The circuit includes a decoder configured to decode a plurality of control bits to generate a plurality of control signals, and a current source having a plurality of devices. The current source is configured to activate at least a subset of the plurality of devices using the control signals to provide a load current to a load circuit, such as a light-emitting diode (LED), using activated ones of the plurality of devices and a control voltage. A control circuit is configured to generate the control voltage based on the load current and a reference current.

20 Claims, 10 Drawing Sheets

HIGH CURRENT, LOW DROPOUT DRIVER CIRCUIT

BACKGROUND

Technical Field

This disclosure is directed to electronic circuits, and more particularly, to circuits for driving light-emitting diodes (LEDs) and other load circuits.

Description of the Related Art

LED driver circuits are used to drive LEDs used in, e.g., displays for different types of devices. Different types of LEDs may be driven by corresponding LED driver circuits. For example, white LEDs may be driven by circuits that use pulse width modulation (PWM), without the current being constantly supplied to the LEDs. The frequency of the pulses used may be such that the non-constant current is not noticeable to the naked eye, while the brightness of such LEDs may be varied with the width of the pulses (with wider pulses corresponding to increased brightness). More recently, colored LEDs have been used in some types of displays. These LEDs may be driven by circuits that provide a constant current, in lieu of using PWM circuits.

SUMMARY

A high current, low dropout driver circuit is disclosed. In one embodiment, the circuit includes a decoder configured to decode a plurality of control bits to generate a plurality of control signals, and a current source having a plurality of devices. The current source is configured to activate at least a subset of the plurality of devices using the control signals to provide a load current to a load circuit, such as a light-emitting diode (LED), using activated ones of the plurality of devices and a control voltage. A control circuit is configured to generate the control voltage based on the load current and a reference current.

In one embodiment, the control circuit comprises a replica device (e.g., a transistor) that has substantially the same dimensions and electrical characteristics as ones of the plurality of devices. Accordingly, the current through individual ones of the plurality of devices is substantially the same as the current through the replica devices. Moreover, the load current at any given time is the number of active devices of the current source multiplied by the reference current.

BRIEF DESCRIPTION OF THE DRAWINGS

The following detailed description makes reference to the accompanying drawings, which are now briefly described.

DETAILED DESCRIPTION OF EMBODIMENTS

Driver circuits are used to provide a current for a load circuit. An example load circuit is an LED in, e.g., a display. Previous solutions to LED driver circuits were designed for LEDs that were white, consumed low power/current, and could be controlled through circuits that implemented techniques such as pulse width modulation (PWM). However, these circuits are not suitable for LEDs that have come into more frequent use. More particularly, current LED usage for displays and other applications has trended toward LEDs that are high power, colored, LEDs that operate using a constant current in lieu of current pulses according to a PWM scheme. Other requirements for driver circuits used with these types of LEDs are low dropout, high current capability, a high dimming ratio, monotonicity, and a low quiescent current.

The present disclosure is thus directed to a driver circuit, such as an LED driver circuit, that is suitable for use with high power LEDs. The circuit includes a current DAC (comprising a number of devices), an equalizer circuit, a regulator circuit, and a decoder. The decoder is capable of activating or deactivating, based on an input code, the various devices (e.g., transistors) of the current DAC. When an LED is used as the load circuit, the devices draw current from a cathode of the LED. The regulator generates a control voltage that is provided to the gate terminal of a replica device as well as the gate terminals of the devices of the current DAC (where the replica device has the same characteristics as the devices of the current DAC), via corresponding switches controlled by the decoder. The equalizer circuit equalizes the drain voltage from the devices of the current DAC to the drain voltage of the replica device. As a result, the terminal voltages on the replica device are equal to each of the active devices of the current DAC. There are N devices in the current DAC, and thus the current drawn through the LED may be anywhere from 0 to N times the drain-source current of the replica device.

The driver circuit of the present disclosure may thus provide a constant (continuous) current with a very low dropout and a high dimming ratio suitable for use in LED applications as well as other application in which a current driver is desired. The current can be changed monotonically, while the quiescent current is low, making it suitable for use in portable (battery-powered) devices.

Additional details are now discussed below. The description begins with a discussion of various embodiments of a driver circuit that may be use to drive an LED, among other applications. Methods of operating a driver circuit are then described, followed by a discussion of an example system which may implement instances of the driver circuit in accordance with the present disclosure.

Figure 1:
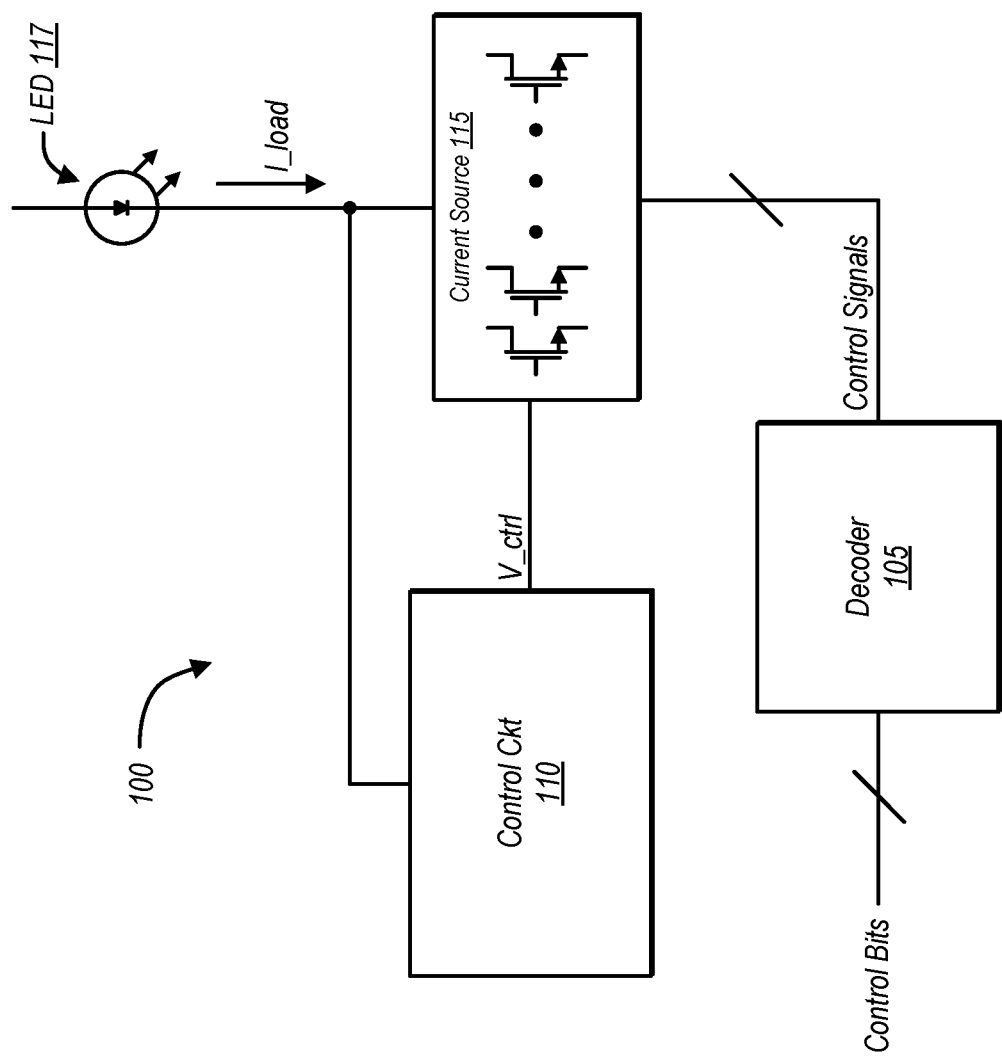
FIG. 1 is a block diagram of one embodiment of a driver circuit.

Driver Circuit Embodiments:

FIG. 1 is a block diagram of one embodiments of a driver circuit coupled to drive an LED. In the embodiment shown, driver circuit 100 includes a control circuit 110, a current source 115, and a decoder 105. Driver circuit 100 is coupled to an LED 117, and is configured to draw a load current, I_load, to drive the LED such that it emits light. LED 117 may be one of several LEDs in, e.g., a display on a mobile device, although this example application is not intended to limit the disclosure. Similarly, driver circuit 100 may be used in applications other than driving an LED, and more generally, any application in which a circuit is desired to draw current in the manner described herein.

Current source 115 in the embodiment shown includes a plurality of devices (e.g., transistors, such as NMOS devices) that can be activated to generate current via the cathode of LED 117. In an alternate embodiment, current source 115 could be connected to the anode of LED 117, with the polarities of other devices reversed accordingly. Control of the amount of current generated by current source 115 may be controlled in part by selecting at least a subset of devices to be activated. In this embodiment, decoder 105 may control which of the plurality of devices are activated in current source 115 via control signals. Decoder 105 may generate the control signals based on control bits that comprise an input code.

Control circuit 110 may also affect the amount of current generated by current source 105 based on a control voltage, Vctrl, that is provided to each of the devices. In one embodiment, the control voltage is provided to a gate terminal of a number of NMOS or PMOS transistors that make up current source 105. The control voltage generated by control circuit 110 is based at least in part on the load current I_load. A reference current source, I_ref, may also be used in generation of the control voltage.

Figure 2:
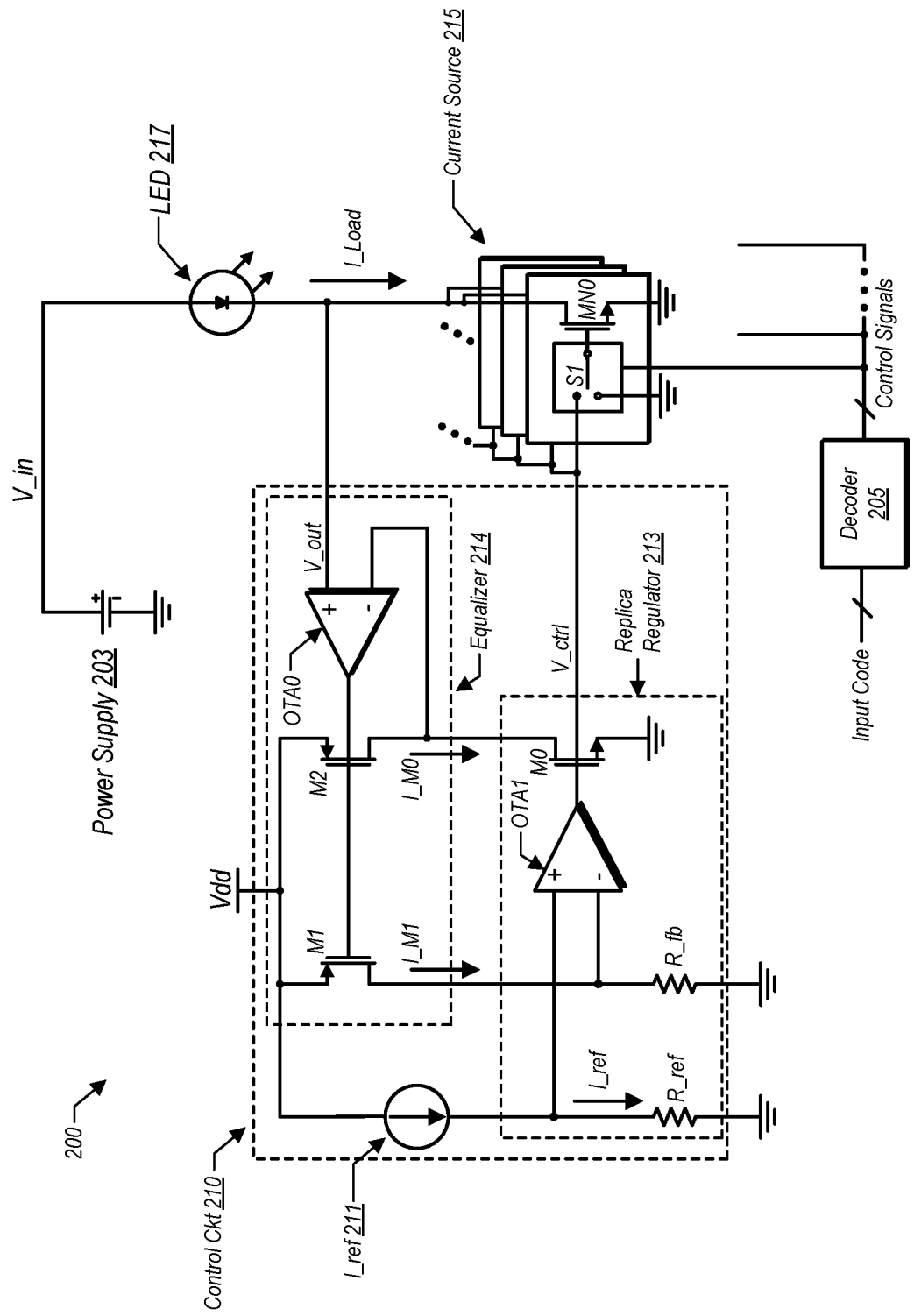
FIG. 2 is a schematic diagram of one embodiment of a driver circuit.

FIG. 2 is a schematic diagram of one embodiment of a driver circuit. In the embodiment shown, driver circuit 200 is configured to drive LED 217, although other loads are possible and contemplated. LED 217 is coupled, via its anode, to a power supply 203 which generates V_in, a regulated supply voltage, although reverse polarity embodiments (as noted above) are also possible and contemplated. Power supply 203 may be a buck converter, boost converter, low dropout (LDO) voltage regulator, or any other suitable type of power supply. LED 217 is provided here as one example of a load circuit, although the disclosure is not intended to be limiting to this type of load.

LED driver circuit 200 in the embodiment shown includes control circuit 210, decoder 205, and current source 215. Control circuit 210 includes an equalizer 214, a replica regulator 213, and a reference current source 211. Replica regulator 213 in the embodiment shown includes operational transconductance amplifier 1 (OTA1), device M0 (e.g., an NMOS transistor), as well as a reference current resistor, R_ref, and a feedback resistor R_fb. Equalizer 214 includes OTA0, and devices M1 and M2. The OTA's in various embodiments may carry out a comparator function in which their respective output signals vary in magnitude and proportion to the voltage difference applied to their respective inputs.

Current source 215 includes a plurality of devices MNO (e.g., NMOS transistors), each of which may be activated or deactivated using a corresponding switch S1 coupled thereto. The control signal output from decoder 205 may be used to selectively activate the various ones of the devices of current source 215. The load current, I_Load, is thus the sum of current through the individual active devices of current source 215. Accordingly, control of the amount of load current is dependent in part on the number of active devices in current source 215, which in turn is dependent on the input code provided to decoder 205. The input code may be provided as a binary code, a thermometer (or thermo-metric) code, or a combination of these (e.g., most significant bits thermometer, least significant bits binary).

The voltage on the cathode of LED 217 in the embodiment shown, V_out is provided to the non-inverting input of OTA0. This arrangement allows OTA0 to monitor V_out. The inverting input of OTA0 is coupled in a feedback configuration to a terminal of M2 (e.g., the drain terminal of a PMOS device in this embodiment). Accordingly, based on the configuration shown here, OTA0 generates an output voltage that is substantially proportional to V_out. In effect, OTA0 operates as a comparator, comparing the drain voltage on the devices of current source 215 and the drain voltage of device M0. Since V_out and I_Load are both taken from the same terminal (the cathode of LED 217 in this embodiment), these values correspond to one another. Therefore, through the comparing operation of OTA0 effectively repeats the voltage on the drain terminals of the devices in current source 215, V_out, to the drain terminal of M0 while also generating the replica current through M0, I_M0.

In the embodiment shown, M2 and M1 effectively operate as a current mirror. The replica current I_M0, which flows through M2 and M0, is mirrored to M1 in order to generate I_M1. In one embodiment, the mirroring of the current through M2/M0 to M1 is performed at a 1:1 ratio, and thus I_M0 and I_M1 are substantially equal. Using the current I_M1, R_fb generates a voltage that is provided to the inverting input of OTA1. Using the reference current, R_ref generates a reference voltage that is input into OTA1. Using these voltages, OTA1 operates as a comparator that generates the control voltage V_ctrl. The control voltage generated by the comparison operation of OTA1 is provided to the gate terminals of M0 as well as the active devices (via corresponding closed switches) in current source 215. In the embodiment shown, the devices MNO in current source 215 are equivalent in size (e.g., same length and width) with each other and with M0. Accordingly, the current I_M0 is substantially equal to the current through any one active device MNO of current source 215. Therefore, the total current I_Load is the product of the current through M0, I_M0, multiplied by the number of active devices of current source 215, with this current being regulated by OTA1.

The arrangement of driver circuit 200 in the embodiment shown provides several mechanisms to control the load current or the possible range of load currents that may be provided. One such mechanism is to adjust or change the reference current, I_ref, provided by reference current source 211. This changes the voltage to the non-inverting input of OTA1, and thus changes the control voltage, V_ctrl, output therefrom. Another mechanism to control the load current is to change the number of active devices in current source 215 by changing the input code to decoder 215. If current source 215 is modeled as a single transistor, changing the number of active devices may thus be equivalent to modulating the width of the modeled single device. Another mechanism for controlling the load current is to control the ratio of respective resistances provided by R_ref and R_fb and thus control the respective input voltages provided to OTA1 and thus change the control voltage, V_ctrl. Changing the size ratio of M1 to M2 may also be used as a mechanism to control the load current, as this results in a change in the ratio of respective drain current in these devices.

In the embodiment shown, OTA0 may be implemented with a low offset to ensure good matching between the load current and the replica current, I_M0. This amplifier may also be implemented with a wide common mode voltage and in a configuration with higher bandwidth than OTA1 to obtain higher phase margin and thus improve overall stability. OTA0 may respond to transients faster than OTA1 since their respective bandwidths do not intersect. By separating their respective bandwidths, OTA0 control the voltage of the drain terminal of M0 (since it forms a follower together with M2), while OTA 1 controls the current on the same node. For OTA1, the common mode voltage is not critical, and may be defined by the product of the reference current I_ref and the resistance of the resistor R_ref. The bandwidth of OTA1 may be lower than that of OTA0, although it may have higher driving capability.

Figure 3:
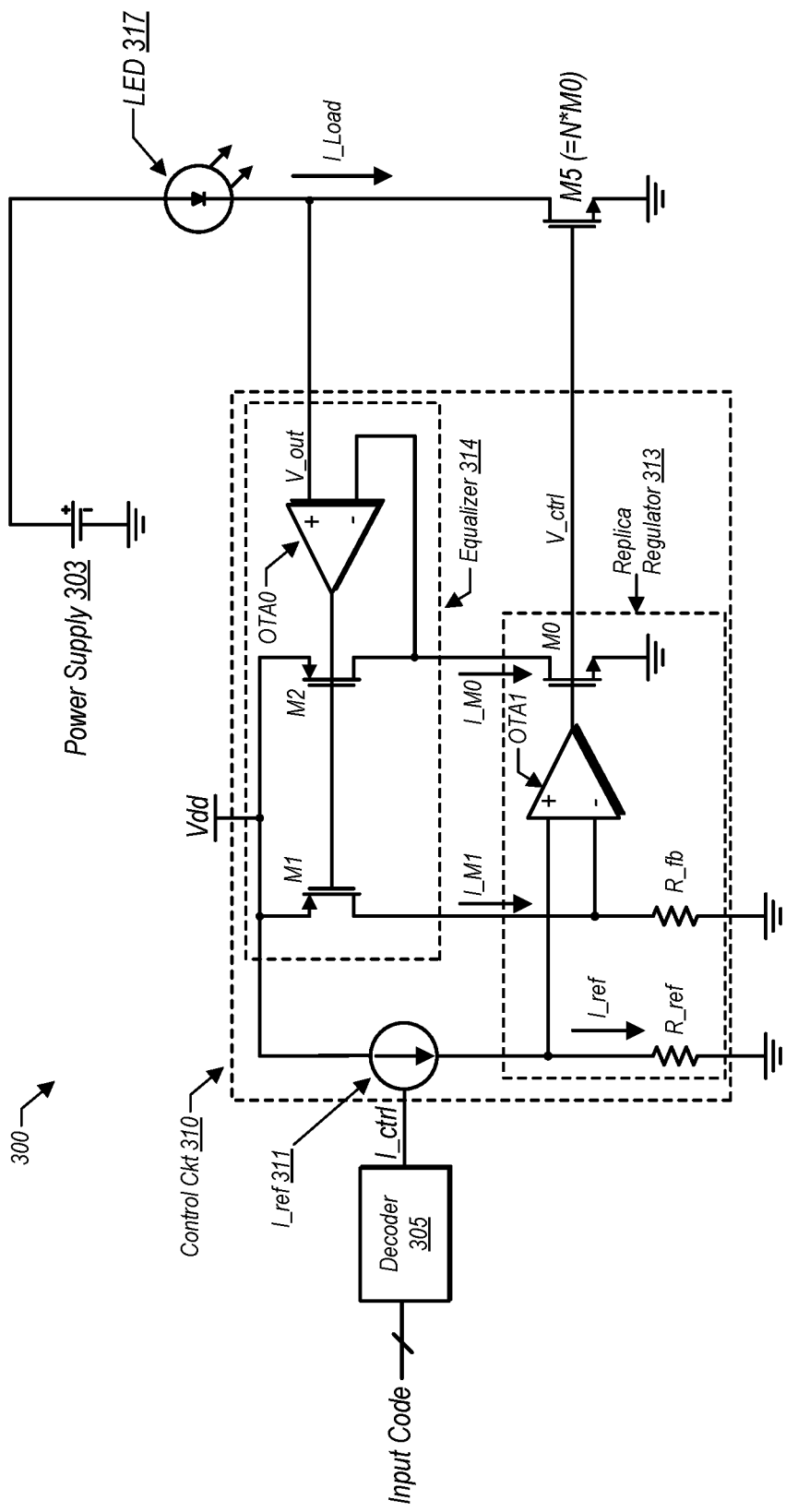
FIG. 3 is a schematic diagram of another embodiment of a driver circuit.

FIG. 3 is a schematic diagram of another embodiment of a driver circuit. In the embodiment shown, driver circuit 300 is coupled to and configured to drive LED 317. In this particular embodiment, the current source generating the current through LED 317 is implemented as a single device, M5, which is sized to be N*M0. Equalizer 314 and replica regulator 313 are arranged similarly to their counterparts in the embodiment shown in FIG. 2.

In the embodiment of FIG. 3, driver circuit 300 varies the load current I_Load through the variation of the reference current, I_ref. This is accomplished via decoder 305, which varies the current generated by reference current source 311 through the I_ctrl signal. The I_ctrl signal is generated by decoder 305 based on the received input code. Varying the input code, and thus varying the reference current I_ref changes the voltage applied to the non-inverting input of OTA1, and thus the changes the control voltage, V_ctrl that is applied to the respective gates of M0 and M5. This in turn changes the replica current and thus, the load current.

Figure 4:
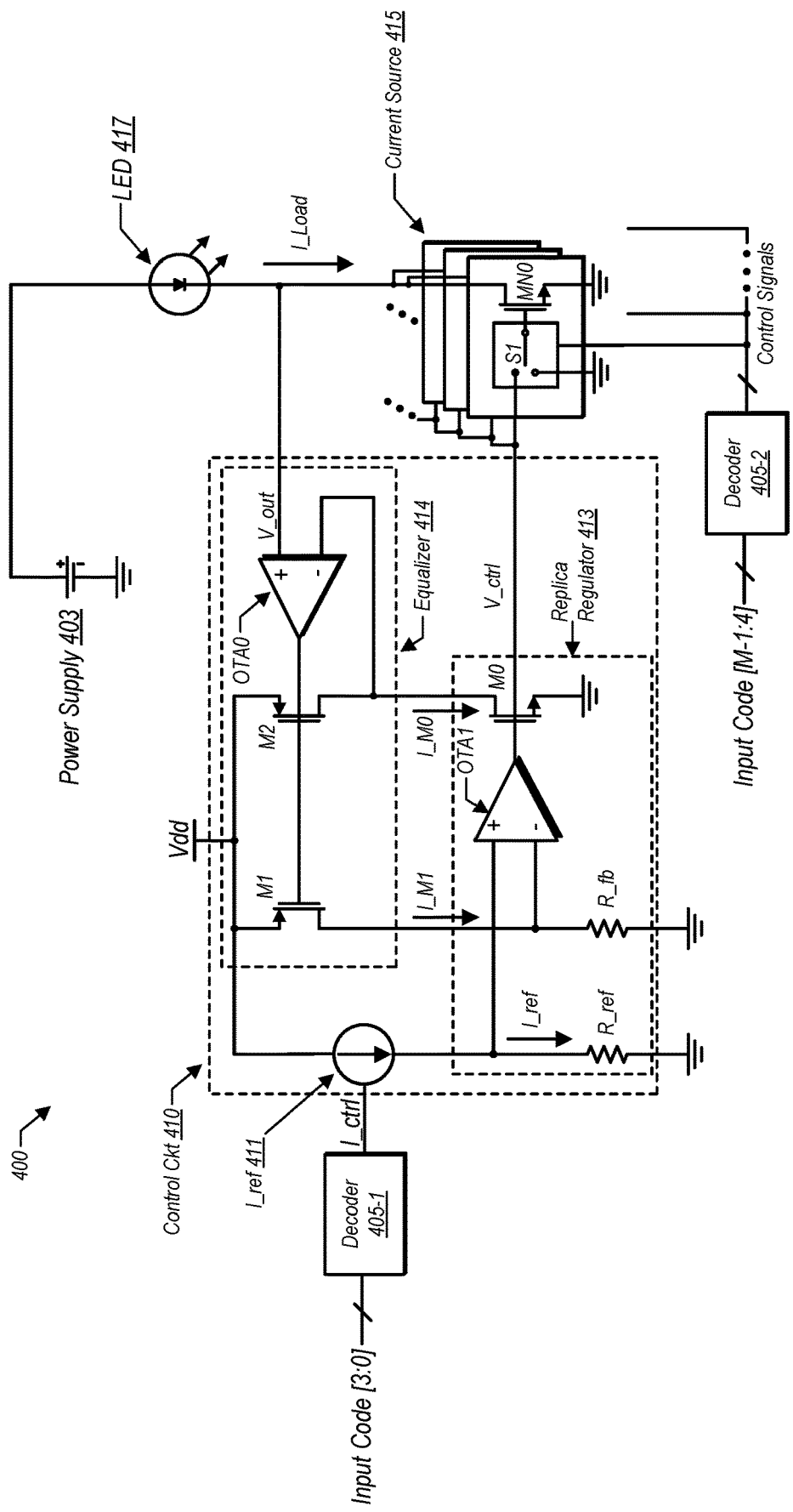
FIG. 4 is a schematic diagram of another embodiment of a driver circuit.

FIG. 4 is a schematic diagram of another embodiment of a driver circuit. In the embodiment shown, driver circuit 400 is configured to generate a current to drive LED 417. Driver circuit 400 combines features of the embodiments shown in FIGS. 2 and 3. The load current I_load in the illustrated embodiment may be adjusted by changing the reference current and/or by changing the number of devices active in current source 415. The reference current in this embodiment may be adjusted by changing the four least significant bits of the input code, which is provided to decoder 405-1, which in turn generates the current control signal, I_ctrl, that is provided to reference current source 411. The most significant bits in this embodiment are provided to decoder 405-2, which generates the control signals used to activate the various devices of current source 415.

The input codes provide to decoders 415-1 and 415-2 may be binary codes, thermometer codes, or any other suitable type. In one embodiment, the least significant bits of the input code (bits 3:0) are provided to decoder 405-1 as a binary code, while the most significant bits (bits M-1:4) are provided to decoder 405-2 as a thermometer code. However, both or either of the groups of code bits may be binary, thermometer, or other suitable code.

Figure 5A:
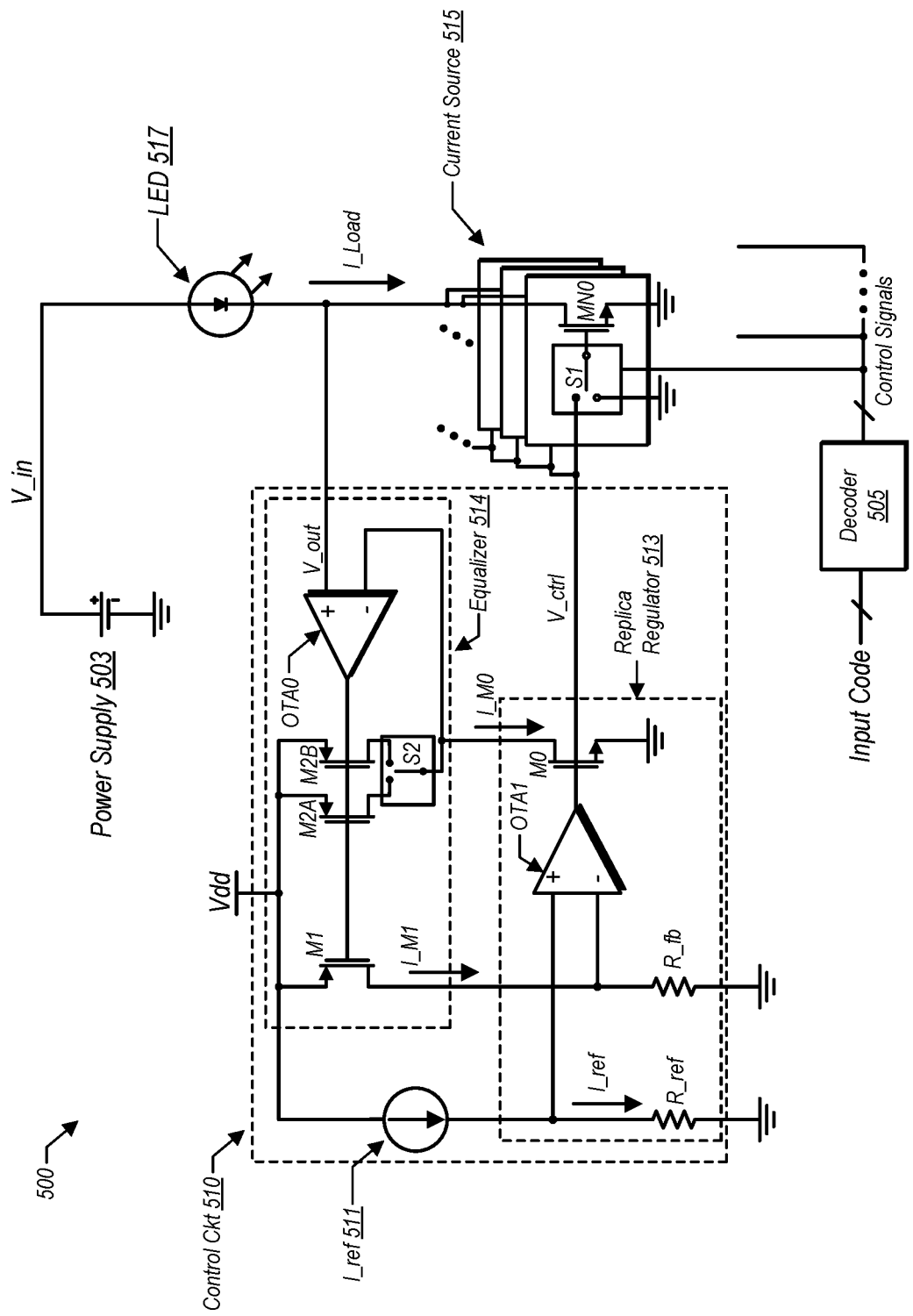
FIG. 5A is a schematic diagram of another embodiment of a driver circuit.

FIG. 5A is a schematic diagram of another embodiment of a driver circuit. In this embodiment, driver circuit 500 generates a current to drive LED 517. In this embodiment, additional control of the current may be provided through switch S2 in equalizer 514. Switch S2 (which may be controlled by a control circuit not shown here) may select one of transistors M2A or M2B to be active at a given time. These devices may be differently sized, and thus changing between one and the other changes the size ratio between devices in different legs of the control circuit 510. For example, M2A may be equally sized with M1, which M2B may be double in size relative to M1. This changes the current that is mirrored to M1, and thus the control voltage generated by OTA1. With this approach the current of current source 515 may be adjusted while keeping the common mode of OTA1. Embodiments are further possible and contemplated in which additional devices are included to allow for a wider range of adjustment, more fine control of individual adjustments, or both. For example, an embodiment having devices to support 16 possible current mirror configurations is possible and contemplated. Embodiments that add additional devices in the position of M1 (e.g., a configuration including an M1A device, M1B device, and so on) with different weights are also possible and contemplated. In general, the embodiment shown in FIG. 5A contemplates a configurable current mirror that may be controlled and selected using various switches.

Figure 5B:
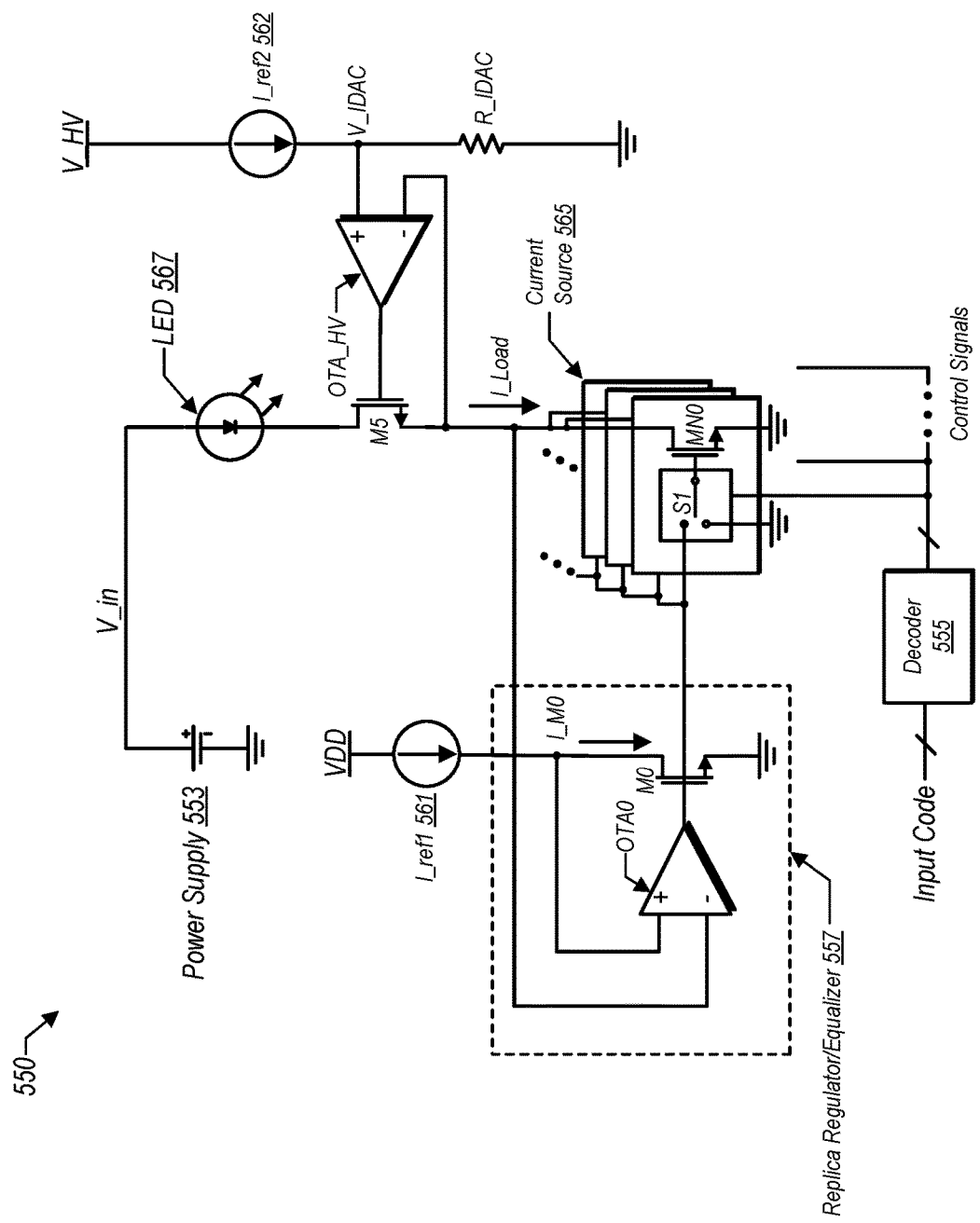
FIG. 5B is a schematic diagram of another embodiment of a driver circuit.

FIG. 5B is a schematic diagram of yet another embodiment of a driver circuit. In this embodiment, the replica regulator and the equalizer functions of driver circuit 550 are combined into a single circuit, replica regulator/equalizer 557, which includes OTA0 and M0. The circuit includes two control loops, one using OTA0 and another one using OTA_HV.

The first control loop, utilizing OTA0, may force a proportional current through transistor M0 based on the reference current from I_Ref1 561 and the voltage differential between the input terminal of OTA0. This difference is based on the drain voltages of M0 and active devices of current source 565. This in turn may force a proportional current through the active devices of current source 565. The active devices are selected based on the control signals generated by decoder 555, which in turn are activated or deactivated based on the received input code.

The second control loop, utilizing OTA_HV and M5 (a high voltage transistor), regulate the voltage on respective drain terminals of the devices of current source 565 to a substantially fixed voltage. This fixed voltage is partly determined by the voltage V_IDAC, which is generated using current source I_ref2 562 and the resistor R_IDAC. In this particular configuration, the first control loop is separated from the second control loop, which is implemented in a high voltage domain. This allows the devices of current source 565 to operate in a lower voltage domain. The embodiment shown may provide significant area savings, as the devices M0 as well as those of the current source 565 may be smaller than their higher voltage counterparts.

Figure 5C:
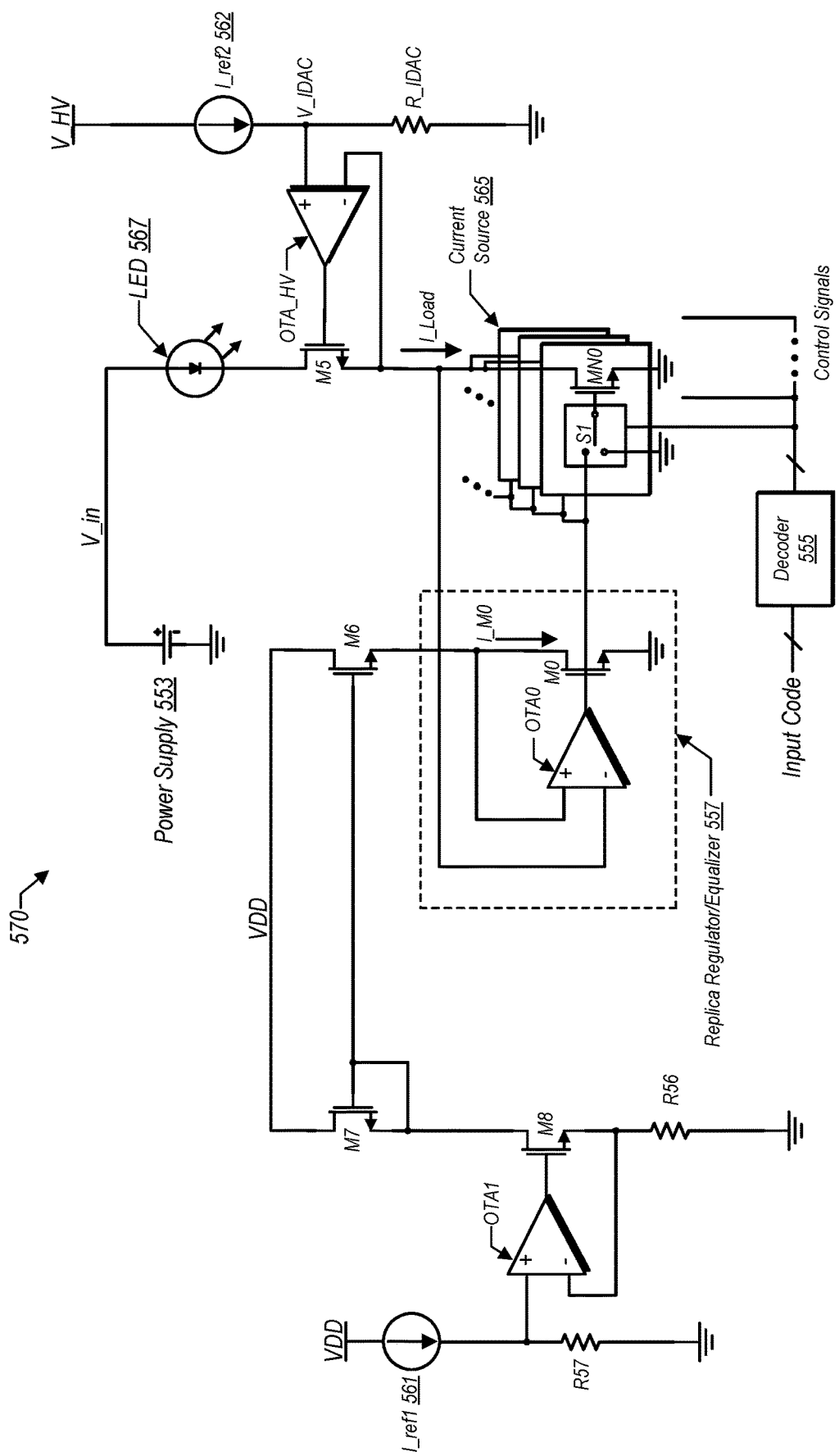
FIG. 5C is a schematic diagram of another embodiment of a driver circuit.

FIG. 5C is one possible variation of the embodiment shown in FIG. 5B. In this embodiment, driver circuit 570 includes a current mirror formed by devices M6 and M7, with a third control loop added that includes OTA1, M8, R56, R57, and I_ref 561. In this embodiment, the LSB current increment (or size), and thus the full scale current may be changed by varying the values of various circuit elements. Changing the resistance value of either of R56 or R57 (and thus changing the ratio between the two) may change the LSB size. Similarly, changing the ratio of device sizes between M6 and M7 may also change the LSB size. The third loop added here generates the current I_M0 using the current mirror of M6 and M7, OTA1, M8, the reference current from I_ref 561, and the voltages generated by current through R56 and R57. Accordingly, the embodiment shown in FIG. 5C allows for high flexibility in adjusting the LSB size, which in turn allows the accommodation of extra functions such as DC accuracy trimming and LSB ranges in exponential order.

Other variations of the embodiments shown in FIGS. 5B and 5C are also possible and contemplated. In one possible alternate embodiment, a reference voltage is applied to, e.g., the inverting input of the OTA in the replica regulator. In such an embodiment, the loop that includes the OTA of the replica regulator operates independently of high voltage OTA (e.g., OTA_HV of FIG. 5C). This helps maintain the stability of the OTA in the replica regulator by avoiding any interaction with the high voltage OTA. The reference voltage for the high voltage OTA may be taken from the drain of the replica device M0. As a result, such an embodiment would provide the advantage of never saturating irrespective of what high voltage loop that drives the LED.

In yet another embodiment, the two control loops may be separated further by generating two independent reference voltages, one for the OTA of the replica regulator and another for the high voltage OTA that is used in the loop that drives the LED. The two reference voltages may be trimmed to the same value. This further separation of the control loops may achieve even greater operational stability.

Another embodiment may improve DC accuracy by elimination of the current mirror. Such an embodiment may implement a second high voltage OTA, the added OTA being in the loop that generates the replica current. A reference current sink to ground may be provided as well (e.g., coupled to the non-inverting input of second high voltage OTA). The bandwidths of the control loops may be separated to prevent interaction with the low voltage loop (that includes the replica regulator), since the band width of the loop including the second high voltage OTA does not influence overall transient response of the circuit.

Figure 6:
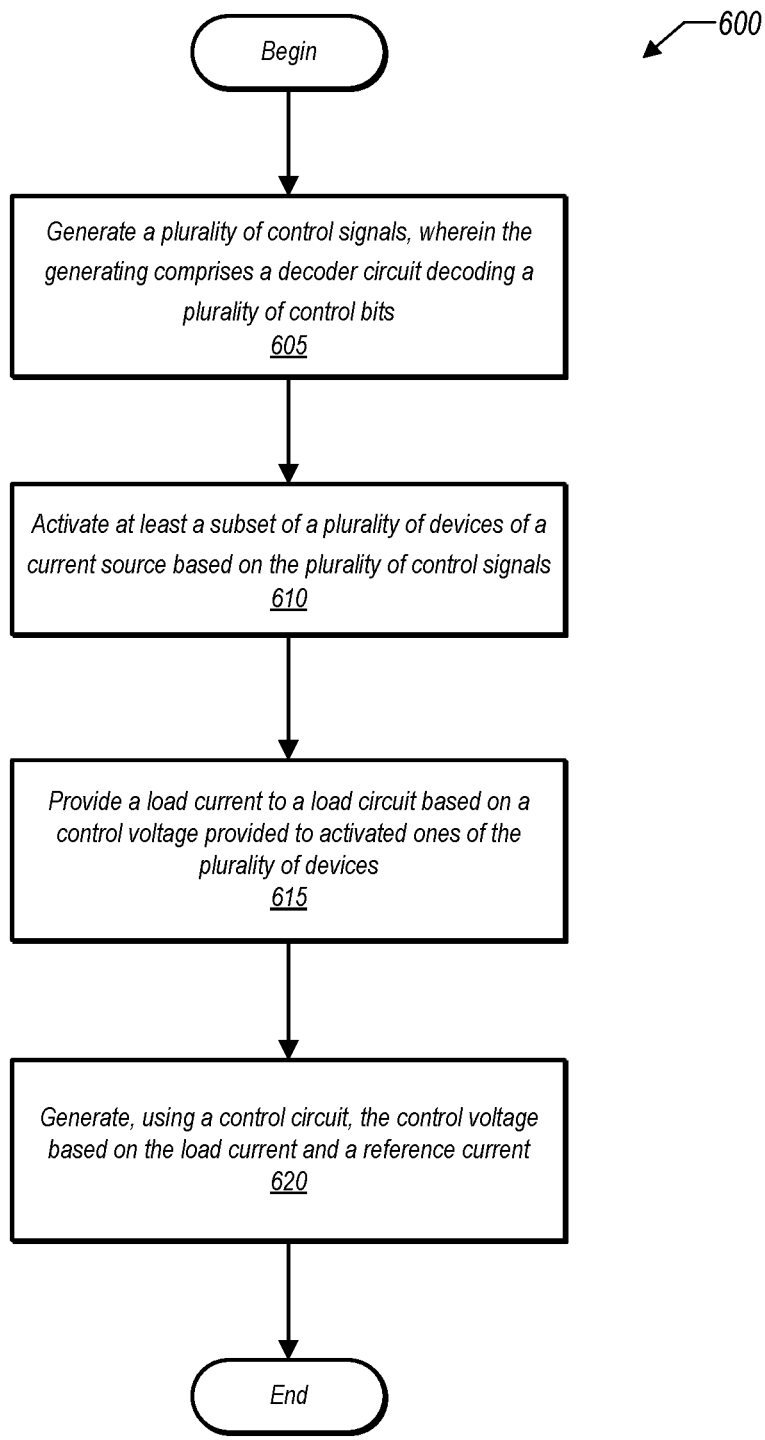
FIG. 6 is a flow diagram of one embodiment of a method for operating a driver circuit.

Method Flow Diagrams:

FIG. 6 is a flow diagram of one embodiment of a method for operating a driver circuit. Method 600 may be carried out by various ones of the circuit embodiments discussed above in reference to FIGS. 1-5. Embodiments of a circuit capable of carrying out Method 600, but not otherwise explicitly disclosed herein may also be consider to fall within the scope of this disclosure.

Method 600 includes generating a plurality of control signals, wherein the generating comprises a decoder circuit decoding a plurality of control bits (block 605), and activating at least a subset of a plurality of devices of a current source based on the plurality of control signals (block 610). The method further includes providing a load current to a load circuit based on a control voltage provided to activated ones of the plurality of devices (block 615) and generating, using a control circuit, the control voltage based on the load current and a reference current (block 620).

In various embodiments, the method includes generating, using an equalization circuit, a copy of the load current, and further include generating, using a regulator circuit and the copy of the load current, the control voltage. Generating the copy of the load current comprises, in one embodiment, a comparator of the equalization circuit generating a comparison voltage by comparing a drain voltage on a control device of the regulator circuit to a drain voltage on activated ones of the plurality of devices. Generating the control voltage includes using a comparator in the regulator circuit to perform a comparison of the copy of the load current to the reference current. The comparator in one embodiment may be an operational transconductance amplifier, which may generate an output signal that varies in magnitude and in proportion to the voltages applied to its inputs. The method also includes providing the control voltage to a gate terminal of a control device, wherein a current through the control device is substantially equal to a current through individual ones of the plurality of devices. In various embodiments, the equalization circuit comprises a current mirror, and thus the method of operating such embodiment further comprises changing a ratio of the current mirror.

Some circuit embodiments may utilize two decoders for generation of the reference current and activating of the devices of the current source. In the operation of such embodiments, the method further includes the decoder circuit providing a first subset of the plurality of the control signals to a reference current generator configured to generate the reference current, and a second subset of the plurality of control signals to control activation of ones of the plurality of devices.

Figure 7:
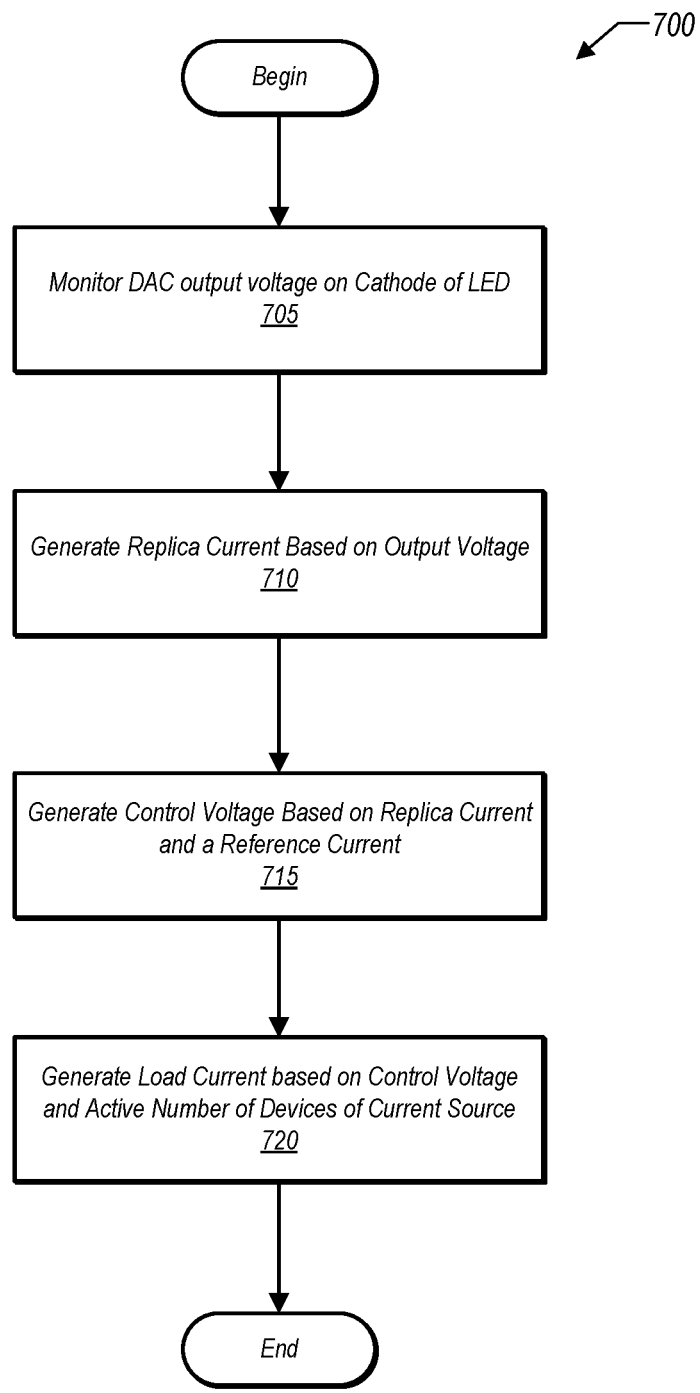
FIG. 7 is a flow diagram of another embodiment of a method for operating a driver circuit.

FIG. 7 is a flow diagram of another embodiment of a method for operating a driver circuit. Method 700 may be applied to various ones of the driver circuits discussed above in reference to FIGS. 1-5. Driver circuits not explicitly disclosed herein, but capable of carrying out Method 700, are also considered to fall within the scope of the disclosure.

Method 700 includes monitoring the output voltage of a DAC at the cathode of an LED (block 705). The DAC may be a current source, such as that of FIG. 7, which includes a number of different devices. The devices may be activated using control signals generated by a decoder circuit based on a digital input code. Thus, the decoder and the current source effectively convert the code into an output current having a particular voltage corresponding the drain voltage of the activated devices.

Method 700 further includes generating a replica current based on the output voltage (block 710). Again, using the embodiment of FIG. 2 as an example, the output voltage may, via an OTA in an equalizer circuit, be conveyed to a device through which the replica current passes. The replica current may be mirrored to another device as well. Using the mirrored replica current and a reference current to generate respective voltage inputs, another OTA of a replica circuit may generate a control voltage (block 715). The load current is generated, based on the control voltage output from the OTA and the number of active devices of the current source (block 720).

Figure 8:
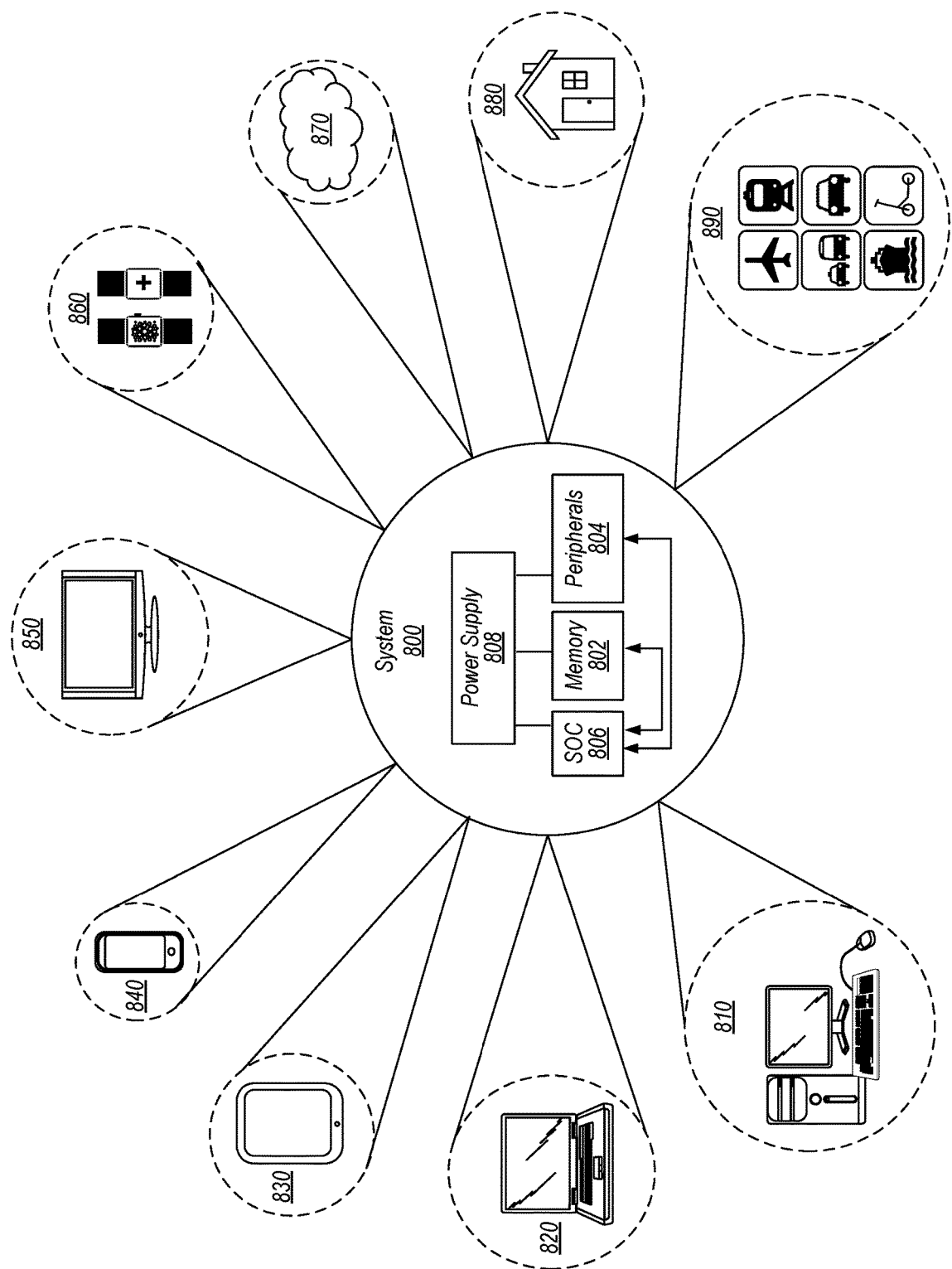
FIG. 8 is a block diagram of one embodiment of an example system.

Example System:

Turning next to FIG. 8, a block diagram of one embodiment of a system 800 is shown that may incorporate and/or otherwise utilize the methods and mechanisms described herein. In the illustrated embodiment, the system 900 includes at least one instance of a system on chip (SoC) 806 which may include multiple types of processing units, such as a central processing unit (CPU), a graphics processing unit (GPU), or otherwise, a communication fabric, and interfaces to memories and input/output devices. In some embodiments, one or more processors in SoC 806 includes multiple execution lanes and an instruction issue queue. In various embodiments, SoC 806 is coupled to external memory 802, peripherals 804, and power supply 808.

A power supply 808 is also provided which supplies the supply voltages to SoC 806 as well as one or more supply voltages to the memory 802 and/or the peripherals 804. In various embodiments, power supply 808 represents a battery (e.g., a rechargeable battery in a smart phone, laptop or tablet computer, or other device). In some embodiments, more than one instance of SoC 806 is included (and more than one external memory 802 is included as well).

The memory 802 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

System 800 in the embodiment shown may implement one or more of the driver circuits discussed above with respect to FIGS. 1-5. For example, system 800 may include at least one LED display with various driver circuits used to adjust the brightness thereof by varying the load current. Other applications of a driver circuit as discussed herein are also possible and contemplated.

The peripherals 804 include any desired circuitry, depending on the type of system 800. For example, in one embodiment, peripherals 804 includes devices for various types of wireless communication, such as Wi-Fi, Bluetooth, cellular, global positioning system, etc. In some embodiments, the peripherals 804 also include additional storage, including RAM storage, solid state storage, or disk storage. The peripherals 804 include user interface devices such as a display screen, including touch display screens or multi-touch display screens, keyboard or other input devices, microphones, speakers, etc.

As illustrated, system 800 is shown to have application in a wide range of areas. For example, system 800 may be utilized as part of the chips, circuitry, components, etc., of a desktop computer 810, laptop computer 820, tablet computer 830, cellular or mobile phone 840, or television 850 (or set-top box coupled to a television). Also illustrated is a smartwatch and health monitoring device 860 (or more generally, and wearable device). In some embodiments, smartwatch 860 may include a variety of general-purpose computing related functions. For example, smartwatch 860 may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 800 may further be used as part of a cloud-based service(s) 870. For example, the previously mentioned devices, and/or other devices, may access computing resources in the cloud (i.e., remotely located hardware and/or software resources). Still further, system 800 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 8 is the application of system 800 to various modes of transportation. For example, system 800 may be used in the control and/or entertainment systems of aircraft, trains, buses, cars for hire, private automobiles, waterborne vessels from private boats to cruise liners, scooters (for rent or owned), and so on. In various cases, system 800 may be used to provide automated guidance (e.g., self-driving vehicles), general systems control, and otherwise. These any many other embodiments are possible and are contemplated. It is noted that the devices and applications illustrated in FIG. 8 are illustrative only and are not intended to be limiting. Other devices are possible and are contemplated.

It is noted that while the circuits discussed above have been implemented using NMOS and PMOS transistors, the disclosure is not intended to limit embodiments falling within its scope to these types of devices. Thus, in addition to various MOSFET types discussed above, the present disclosure also contemplates embodiments that use non-planar devices such as FinFETs, GAAFETs (Gate All Around FETs), among other types. Embodiments implemented using Bipolar devices are also possible and contemplated. The disclosure further contemplates that technologies that are speculative as of this writing may be used to implement devices in various embodiments of the circuits discussed herein. These technologies include (but are not limited to) graphene transistors, carbon nanotube transistors, gallium arsenide transistors, and so on. The use of memristors in certain circuit structures is also contemplated.

The present disclosure includes references to "an embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some tasks even if the structure is not currently being operated. Thus, an entity described or recited as being "configured to" perform some tasks refers to something physical, such as a device, circuit, a system having a processor unit and a memory storing program instructions executable to implement the task, etc. This phrase is not used herein to refer to something intangible.

In some cases, various units/circuits/components may be described herein as performing a set of tasks or operations.

It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112 (f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a decoder configured to decode a plurality of bits to generate a plurality of control signals;
   a current source including a plurality of devices, wherein the current source is configured to:
   activate at least a subset of the plurality of devices using the plurality of control signals; and provide a load current to a light-emitting diode (LED) using activated ones of the plurality of devices and a control voltage; and
a control circuit configured to generate the control voltage based on the load current and a reference current.

2. The apparatus of claim 1, wherein the control circuit includes an equalization circuit configured to generate a copy of the load current, and a regulator circuit configured to generate the control voltage using the copy of the load current.

3. The apparatus of claim 2, wherein the equalization circuit includes a comparator circuit configured to generate a comparison voltage corresponding to the load current, wherein the copy of the load current is generated based on the comparison voltage.

4. The apparatus of claim 3, wherein, in generating the comparison voltage, the comparator circuit is configured to compare a first drain voltage present on a control device of the regulator circuit and a second drain voltage present on respective drain terminals of the plurality of devices.

5. The apparatus of claim 2, wherein the regulator circuit includes:
a comparator circuit configured to generate the control voltage by comparing the copy of the load current to the reference current; and
a control device having a gate terminal coupled to receive the control voltage, wherein the control device and ones of the plurality of devices have substantially equal electrical characteristics.

6. The apparatus of claim 5, wherein the load current is substantially equal to a current through the control device multiplied by a number of active ones of the plurality of devices.

7. The apparatus of claim 2, wherein the equalization circuit includes a current mirror and a switch, wherein, when the switch is in a first position, the current mirror is configured to mirror current according to a first ratio, and when the switch is in a second position, the current mirror is configured to mirror current according to a second ratio.

8. The apparatus of claim 1, wherein the decoder is configured to provide a first subset of the plurality of bits to a reference current circuit configured to generate the reference current, and a second subset of the plurality of bits to generate the plurality of control signals.

9. The apparatus of claim 1, wherein the current source comprises an M-bit thermometric current digital-to-analog converter (IDAC) and an N-bit binary IDAC.

10. The apparatus of claim 1, wherein the decoder is configured to use a least significant subset of the plurality of bits to generate the reference current and a most significant subset of the plurality of bits to generate the plurality of control signals.

11. A method comprising:
generating a plurality of control signals, wherein the generating comprises a decoder circuit decoding a plurality of control bits;
activating at least a subset of a plurality of devices of a current source based on the plurality of control signals;
providing a load current to a load circuit based on a control voltage provided to activated ones of the plurality of devices; and
generating, using a control circuit, the control voltage based on the load current and a reference current.

12. The method of claim 11, further comprising:
generating, using an equalization circuit, a copy of the load current; and
generating, using a regulator circuit and the copy of the load current, the control voltage.

13. The method of claim 12, wherein generating the copy of the load current comprises a comparator of the equalization circuit generating a comparison voltage by comparing a drain voltage on a control device of the regulator circuit to a drain voltage on activated ones of the plurality of devices.

14. The method of claim 12, further comprising:
generating the control voltage, using a comparator in the regulator circuit, by comparing the copy of the load current to the reference current; and
providing the control voltage to a gate terminal of a control device, wherein a current through the control device is substantially equal to a current through individual ones of the plurality of devices.

15. The method of claim 12, wherein the equalization circuit comprises a current mirror, and wherein the method further comprises changing a ratio of the current mirror.

16. The method of claim 11, further comprising the decoder circuit providing a first subset of the plurality of the control signals to a reference current generator configured to generate the reference current, and a second subset of the plurality of control signals to control activation of ones of the plurality of devices.

17. A system comprising:
a current source configured to drive a load circuit with a load current, wherein the current source includes a plurality of devices;
a decoder circuit configured to, based on an input code, selectively activate ones of the plurality of devices; and
a control circuit configured to generate a control voltage provided to a gate terminal of a replica device and corresponding ones of the plurality of devices, wherein the control circuit is configured to generate the control voltage based on a reference current, and wherein the replica device and the plurality of devices of the current source have substantially equal electrical characteristics;
wherein the replica device is configured to generate a replica current, and wherein the current source is configured to generate the load current based on the replica current and a number of the plurality of devices that are active.

18. The system of claim 17, wherein the control circuit comprises:
an equalization circuit, wherein the equalization circuit includes configured to generate a copy of the load current; and
a regulator circuit configured to generate the control voltage based on the copy of the load current and the reference current.

19. The system of claim 17, wherein the decoder circuit is a thermometric decoder configured to generate a plurality of bits based on an input code, and further configured to control the reference current using a first subset of the plurality of bits and a number of active ones of the plurality of devices using a second subset of the plurality of bits.

20. The system of claim 17, wherein the load circuit is a colored light-emitting diode (LED).

* * * * *

UNITED STATES PATENT AND TRADEMARK OFFICE
CERTIFICATE OF CORRECTION

| | |
|---|---|
| PATENT NO. | : 12,273,977 B2 |
| APPLICATION NO. | : 18/338916 |
| DATED | : April 8, 2025 |
| INVENTOR(S) | : Cristian Grecu et al. |

It is certified that error appears in the above-identified patent and that said Letters Patent is hereby corrected as shown below:

In the Specification

In Column 3, Line 23, please delete "current source 105" and insert -- current source 115 --.

In Column 3, Line 27, please delete "current source 105" and insert -- current source 115 --.

Signed and Sealed this
Twelfth Day of August, 2025

Coke Morgan Stewart
*Acting Director of the United States Patent and Trademark Office*